United States Patent
Cheng et al.

(10) Patent No.: US 9,679,980 B2
(45) Date of Patent: Jun. 13, 2017

(54) COMMON SOURCE OXIDE FORMATION BY IN-SITU STEAM OXIDATION FOR EMBEDDED FLASH

(71) Applicant: Taiwan Semiconductor Manufacturing Co., Ltd., Hsin-Chu (TW)

(72) Inventors: Yu-Hung Cheng, Tainan (TW); Cheng-Ta Wu, Shueishang Township (TW); Yeur-Luen Tu, Taichung (TW); Chia-Shiung Tsai, Hsin-Chu (TW); Ru-Liang Lee, Hsinchu (TW); I-Ting Li, Chiayi (TW); Ming-Hsiang Kao, Tainan (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 71 days.

(21) Appl. No.: 14/208,905

(22) Filed: Mar. 13, 2014

(65) Prior Publication Data

US 2015/0263123 A1    Sep. 17, 2015

(51) Int. Cl.
*H01L 29/788*    (2006.01)
*H01L 29/66*    (2006.01)
(Continued)

(52) U.S. Cl.
CPC .. *H01L 29/42328* (2013.01); *H01L 21/28273* (2013.01); *H01L 27/11521* (2013.01);
(Continued)

(58) Field of Classification Search
CPC .......... H01L 29/7881; H01L 29/42328; H01L 29/66825; H01L 27/28273; H01L 27/11521; G11C 16/0433
See application file for complete search history.

(56) References Cited

U.S. PATENT DOCUMENTS 5,744,834 A    4/1998  Lee
8,008,702 B2 *  8/2011  Wang ................ H01L 27/11521
                                                   257/314
(Continued)

OTHER PUBLICATIONS

Trowbridge, et al. "Enhanced Oxidation of Silicon Nitride Using In Situ Steam Generation." Sixth International Syposium on Silicon Nitride and Silicon Dioxide Thin Insulating Films. Mar. 28, 2001.
(Continued)

*Primary Examiner* — Cheung Lee
*Assistant Examiner* — Stephen C Smith
(74) *Attorney, Agent, or Firm* — Eschweiler & Polashnik, LLC (57) ABSTRACT

The present disclosure relates to an embedded flash memory cell having a common source oxide layer with a substantially flat top surface, disposed between a common source region and a common erase gate, and a method of formation. In some embodiments, the embedded flash memory cell has a semiconductor substrate with a common source region separated from a first drain region by a first channel region and separated from a second drain region by a second channel region. A high-quality common source oxide layer is formed by an in-situ steam generation (ISSG) process at a location overlying the common source region. First and second floating gate are disposed over the first and second channel regions on opposing sides of a common erase gate having a substantially flat bottom surface abutting a substantially flat top surface of the common source oxide layer.

20 Claims, 3 Drawing Sheets

(51) Int. Cl.
*H01L 29/423* (2006.01)
*H01L 21/28* (2006.01)
*H01L 27/11521* (2017.01)
*G11C 16/04* (2006.01)

(52) U.S. Cl.
CPC .... *H01L 29/66825* (2013.01); *H01L 29/7881* (2013.01); *G11C 16/0433* (2013.01)

(56) References Cited

U.S. PATENT DOCUMENTS

| | | | |
|---|---|---|---|
| 8,119,538 | B1 | 2/2012 | Byunn et al. |
| 8,273,625 | B2 | 9/2012 | Shen et al. |
| 2004/0180495 | A1* | 9/2004 | Hung ............... H01L 27/11521 438/257 |
| 2004/0256657 | A1* | 12/2004 | Hung ............... H01L 27/115 257/315 |
| 2005/0207199 | A1* | 9/2005 | Chen ................ G11C 16/0425 365/51 |
| 2008/0217675 | A1* | 9/2008 | Liu ................... H01L 21/28273 257/321 |
| 2009/0207662 | A1* | 8/2009 | Wang ............... H01L 27/11521 365/185.18 |
| 2011/0248328 | A1* | 10/2011 | Shen ................ H01L 21/28273 257/316 |
| 2015/0021679 | A1* | 1/2015 | Tsair ................ H01L 29/788 257/320 |

OTHER PUBLICATIONS

Bidaud, et al. "High Reliable In Situ Steam Generation Process for 1.5-2.5nm Gate Oxides." Rapid Thermal and Other Short-Time Processing Technologies I. May 2000.

Kuppurao, et al. "In Situ Steam Generation: A New Rapid Thermal Oxidation Technique." Solid State Technology; Jul. 2000, vol. 43, Issue 7.

Xian Liu, et al., "Endurance Characteristics of SuperFlash® Memory," 8th International Conference on Solid-State and Integrated Circuit Technology, 2006, p. 763-765, Oct. 23-26, 2006.

* cited by examiner

COMMON SOURCE OXIDE FORMATION BY IN-SITU STEAM OXIDATION FOR EMBEDDED FLASH

BACKGROUND

Today's electronic devices (e.g., computers, digital cameras, video games, etc.) commonly contain electronic memory that is used to store data (e.g., files, pictures, etc.). Electronic memory comes in a variety of different types. One widely used type of electronic memory is Flash memory. Flash memory is a non-volatile memory (i.e., a memory that retains data when not powered) that provides for easy and fast data storage.

Flash memory stores information in memory cells having a floating gate separated from an overlying control gate and an underlying transistor channel region by an insulating layer. Because the floating gate is electrically isolated from the channel region by the insulating layer, charges placed on it are trapped. The trapped charges are indicative of a data state stored in the memory cell. For example, to read a flash memory cell the channel region's conductivity is tested (e.g., if it's conducting or insulating) by applying a voltage to the control gate. Since the channel region's conductivity is influenced by charges on the floating gate, the current flow through the channel region can be measured and used to reproduce the stored data state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some flash memory cell configurations comprise a pair of memory cells that share a common source region located within a semiconductor substrate. The memory cells respectively have a floating gate disposed between a drain region and the shared common source region. During an erase operation, charges from the floating gate are provided to the common source region or to an overlying common erase gate. The common erase gate is separated from the common source region by a common source oxide layer that is configured to provide electrical isolation between the common erase gate and the common source region.

Typically, the common source oxide layer is formed over the semiconductor substrate using a wet furnace oxidation process that provides for significantly higher growth rates than a dry oxidation processes. The wet furnace oxidation process exposes the silicon substrate to a high temperature environment in the presence of water vapor. Water from the water vapor diffuses through the oxide layer to an oxide/silicon interface, wherein the water interacts with silicon to form silicon dioxide (e.g., Si (solid)+$H_2O$ (gas)->$SiO_2$ (solid)+$2H_2$ (gas)).

However, wet furnace oxidation processes cause the common source oxide layer to bulge outward from the semiconductor substrate, providing the overlying common erase gate with a bottom surface having a convex curvature that forms non-uniformities in an electric field generated by the common erase gate (when a voltage is applied). The non-uniformities in the electric field can cause a lower breakdown voltage ($V_{bd}$) and reliability issues. Furthermore, wet furnace oxidation processes also provide for a poor quality oxide due to dangling bonds in non-reactive silicon. The poor quality oxide increases a roughness at an interface between the common source oxide layer and the overlying common erase gate, and can cause erase current fluctuations.

Accordingly, the present disclosure relates to an embedded flash memory cell having a common source oxide layer with a substantially flat top surface, disposed between a common source and a common erase gate, and a method of formation. In some embodiments, the embedded flash memory cell has a semiconductor substrate with a common source region separated from a first drain region by a first channel region and separated from a second drain region by a second channel region. A high-quality common source oxide layer is formed by an in-situ steam generation (ISSG) process at a location overlying the common source region. First and second floating gate are disposed over the first and second channel regions on opposing sides of a common erase gate located on the common source oxide layer. The common erase gate has a substantially flat bottom surface abutting a substantially flat top surface of the common source oxide layer. The substantially flat top surface of the common source oxide improves the breakdown voltage and reliability of the flash memory cell.

Figure 1A:
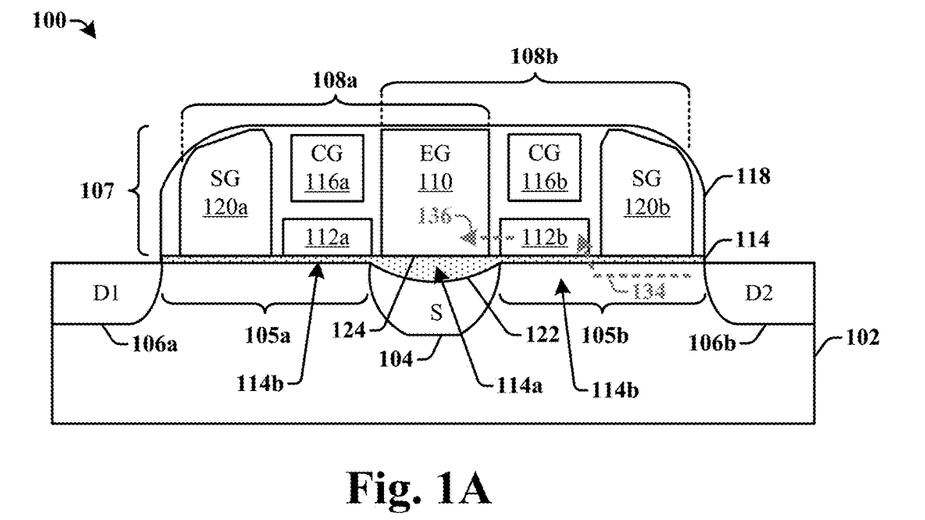
FIG. 1A is a cross-sectional view of some embodiments of an embedded flash memory cell having a common source oxide layer with a substantially flat top surface.

FIG. 1A is a cross-sectional view of some embodiments of an embedded flash memory cell 100 (i.e., a non-standalone flash memory cell that is integrated into an integrated circuit comprising logical elements).

The embedded flash memory cell 100 comprises a semiconductor substrate 102 having a common source region 104 located between a first drain region 106a and a second drain region 106b. The common source region 104, the first drain region 106a, and the second drain region 106b are disposed along a top surface of the semiconductor substrate 102. A first channel region 105a extends between the common source region 104 and the first drain region 106a. A second channel region 105b extends between the common source region 104 and the second drain region 106b. In some embodiments, the common source region 104 may comprise a high dopant concentration (e.g., greater than or equal to 1E19 $cm^{-3}$). In some embodiments, the common source region 104 may comprise boron or phosphorous dopants.

A gate region 107 comprising a plurality of gate structures is disposed over the semiconductor substrate 102. The gate region 107 is separated from the semiconductor substrate 102 by a dielectric layer 114. In some embodiments, the dielectric layer 114 may comprise an oxide layer (e.g., $SiO_2$, $GeO_2$, $Ga_2O_3$, etc.). The dielectric layer 114 electrically isolates one or more of the gate structures from the channel regions, 105a and 105b, and the common source region 104. The gate region 107 comprises a first data storage area 108a and a second data storage area 108b, which are configured to share the common source region 104 and an overlying common erase gate 110.

The first data storage area 108a comprises a first floating gate 112a disposed over the first channel region 105a. The first floating gate 112a may be configured to store charges associated with a first data state (e.g., a '1' or a '0'). The first floating gate 112a is separated from the underlying semiconductor substrate 102 by a floating gate oxide layer 114b (a part of dielectric layer 114 disposed between the semiconductor substrate 102 and the floating gate 112a) and from an overlying first control gate 116a by additional dielectric material 118. A first select gate 120a is disposed on a first side of the first floating gate 112a. The common erase gate 110 is disposed on a second side of the first floating gate 112a opposing the first side. The additional dielectric material 118 separates the first floating gate 112a from the first select gate 120a and the common erase gate 110.

The second data storage area 108b comprises a second floating gate 112b disposed over the second channel region 105b. The second floating gate 112b may be configured to store charges associated with a second data state. The second floating gate 112b is separated from the underlying semiconductor substrate 102 by the floating gate oxide layer 114b and from an overlying second control gate 116b by the additional dielectric material 118. A second select gate 120b is disposed on a first side of the second floating gate 112b. The common erase gate 110 is disposed on a second side of the second floating gate 112b opposing the first side. The additional dielectric material 118 separates the second floating gate 112b from the second select gate 120b and the common erase gate 110.

A common source oxide layer 114a (a part of dielectric layer 114 disposed between the common source region 104 and the common erase gate 110) extends between the common erase gate 110 and the common source region 104 at a position laterally disposed between the first floating gate 112a and the second floating gate 112b. The common source oxide layer 114a is configured to provide electrical isolation between the common erase gate 110 and the common source region 104. The common source oxide layer 114a has a curved bottom surface that abuts a top surface of the common source region 104 at interface 122. The common source oxide layer 114a is formed using an in-situ steam generation (ISSG) process that provides oxygen and hydrogen free radicals at a top interface of the semiconductor substrate 102, thereby causing the common source oxide layer 114a to have a small upward volume expansion that provides the common source oxide layer 114a with a substantially flat top surface. The substantially flat top surface of the common source oxide layer 114a abuts a substantially flat bottom surface of the common erase gate 110 at interface 124.

The substantially flat top surface of the common source oxide layer 114a provides for a better yield and reliability in contrast to common source oxide layers formed by wet furnace oxidation methods, which have a curved top surface. For example, the substantially flat top surface of the common source oxide layer 114a provides for a substantially flat bottom surface of the common erase gate 110, which prevents performance degrading non-uniformities in an electric field that may occur when a voltage is applied to a common erase gate having a curved bottom surface.

Figure 1B:
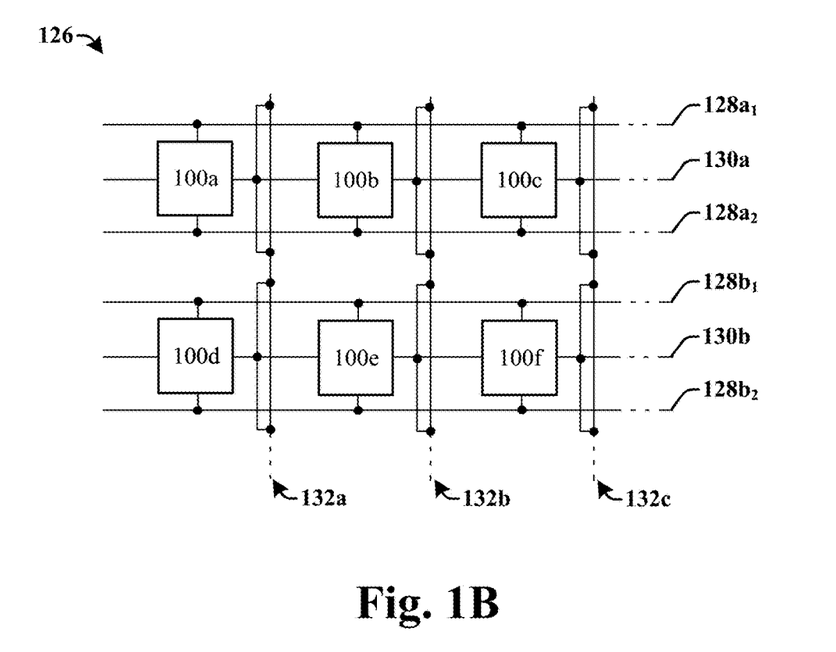
FIG. 1B illustrates a schematic view of some embodiments of an embedded flash memory array having a plurality of memory cells (corresponding to FIG. 1A).

FIG. 1B illustrates a schematic view of a flash memory array 126 having a plurality of embedded flash memory cells 100a-100f (corresponding to FIG. 1A).

The flash memory array 126 comprises rows of embedded flash memory cells (e.g., 100a, 100b, 100c, etc.) coupled to common word lines, $128a_x$ and $128b_x$, and to common source lines, 130a and 130b. The flash memory array 126 further comprises columns of embedded flash memory cells (e.g., 100a, 100d, etc.) coupled to common bit lines 132a-132c. For example, embedded flash memory cell 100a has a first select gate (e.g., 120a) connected to a first word line $128a_1$, a second select gate (e.g., 120b) connected to a second word line $128b_1$, a source region (e.g., 104a) connected to a source line 130a, a first drain region (e.g., 106a) connected to a first common bit line 132a, and a second drain region (e.g., 106b) connected to a second common bit line 132b.

During operation, conduction of charge carriers within a channel region 105 (e.g., 105a or 105b) is controlled by a series combination of a floating gate 112 and a select gate 120. For example, a flash memory cell 100 can be programmed (written) by applying a high voltage to a control gate 116 to form an electric field between a floating gate 112 and a channel region 105, and by concurrently applying a voltage to a select gate 120. Electrons from the channel region 105 are injected (along line 134 as shown in FIG. 1A) as hot carriers across the floating gate oxide layer 114b to charge the floating gate 112. This injected charge alters the floating gate threshold voltage to represent a logic '0' state (while an uncharged floating gate represents a '1' state). Erasing the flash memory cell 100 may be accomplished by applying a negative voltage to the common erase gate 110 to drive stored charges from the floating gate 112 to the common erase gate 110 by the process of Fowler-Nordheim tunneling (along line 136 as shown in FIG. 1A).

Once programmed, a flash memory cell 100 may be read by applying reference voltages to the select gate 120 (via word line 128) and to the drain region 106 (via bit line 132) while the common source region 104 is grounded. For example, a reference voltage applied to the word line 128 turns on a select gate 120 and an associated a portion of the channel region 105. The embedded flash memory cell 100 conducts current if the floating gate 112 is erased (low threshold state) and the embedded flash memory cell 100 outputs a logical '1'. However, the embedded flash memory cell 100 is non-conductive if the floating gate 112 is programmed (high threshold state) and the embedded flash memory cell 100 outputs a logical "0".

Figure 2:
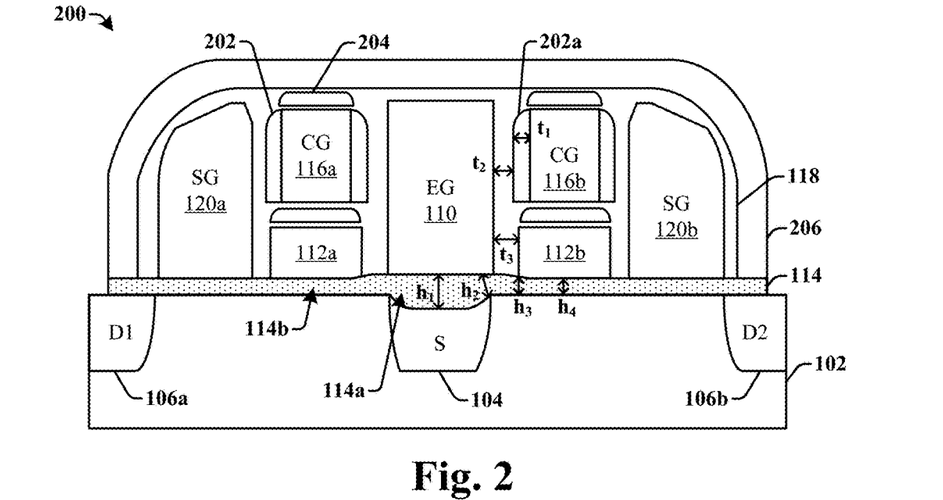
FIG. 2 illustrates a cross-sectional view of some additional embodiments of an embedded flash memory cell having a common source oxide layer with a substantially flat top surface.

FIG. 2 illustrates a cross-sectional view of some more detailed embodiments of an embedded flash memory cell 200.

Flash memory cell 200 comprises a dielectric layer 114 disposed over a semiconductor substrate 102. In various embodiments, the semiconductor substrate 102 may comprise silicon or another known semiconductor material. Floating gates, 112a and 112b, are located over the dielectric layer 114. The floating gates, 112a and 112b, may comprise polysilicon, metal, metal silicide, metal nitride, or dielectric having a high trapping density, such as silicon nitride.

The dielectric layer 114 comprises a common source oxide layer 114a and a floating gate oxide layer 114b. The common source oxide layer 114a is disposed between a common source region 104 and a common erase gate 110. The floating gate oxide layer 114b is disposed between the semiconductor substrate 102 and the floating gates, 112a and 112b. A height of the common source oxide layer 114a varies as a function of lateral position. In some embodiments, the common source oxide layer 114a may have a first height $h_1$ at a location below a center of the common erase gate 110, which is larger than a second height $h_2$ located at an edge of the common erase gate 110. For example, in some embodiments, the first height $h_1$ may be in a range of between approximately 10 nm and approximately 40 nm and the second height $h_2$ may be in a range of between approximately 7 nm and approximately 15 nm.

The common source oxide layer 114a is formed from an ISSG process. The ISSG process provides for a minimum upward volume expansion of the oxide layer during formation, which causes the common source oxide layer 114a to have a substantially flat upper surface. The flat upper surface of the common source oxide layer 114a improves the uniformity of the floating gate oxide layer 114b since the minimum upward volume expansion decreases the expansion of the floating gate oxide layer 114b at its edges. In various embodiments, the floating gate oxide layer 114b may have a thickness that varies by between approximately 3-4 nm between an outer edge of a floating gate 112 and a center of the floating gate 112. For example, the floating gate oxide layer 114b may have a third height $h_3$ in a range of between approximately 11 nm and 12 nm at an edge of the floating gates, 112a and 112b, and a fourth height $h_4$ in a range of between approximately 7 nm and 9 nm at a center of the floating gates, 112a and 112b. The high degree of uniformity of the floating gate oxide layer 114b provides for accurate programming of the floating gates, 112a and 112b, since charge carriers used to program the floating gates, 112a and 112b, are injected into the floating gates, 112a and 112b, from the underlying channel regions, 105a and 105b.

The common source oxide layer 114a (which is formed by the ISSG process) is further differentiable from an oxide layer formed using a wet furnace oxidation process due to a density and low level of defects of the common source oxide layer 114a. For example, the common source oxide layer 114a has a larger density than that of an oxide layer formed using a wet furnace oxidation process. The larger density of the common source oxide layer 114a allows for a thinner common source oxide layer 114a to provide electrical isolation between the common erase gate 110 and the common source region 104. For example, in some embodiments, the common source oxide layer 114a is configured to provide for a breakdown voltage that is similar to that of an oxide formed using a wet furnace oxidation process, which is twice as thick.

The common source oxide layer 114a also comprises less defects in comparison to an oxide layer formed using a wet furnace oxidation. For example, since the common source oxide layer 114a overlies the common source region 104, an oxidation processes used to form the common source oxide layer 114a will consume doped semiconductor material from the common source region 104. An oxide resulting from a wet furnace oxidation process will have dopant impurities (e.g., phosphate, boron, arsenic, etc.) from the common source region 104, which reduce the breakdown voltage of the oxide. Common source oxide layer 114a has a lower concentration of such impurities, since the ISSG process removes such dopant impurities during formation of the oxide (e.g., by burning away the dopant impurities at a high temperature). The common source oxide layer 114a also includes fewer defects due to non-reactive silicon (i.e., silicon that is not oxidized).

Control gates, 116a and 116b, are disposed over the floating gates, 112a and 112b, while select gates, 120a and 120b, are disposed next to the floating gate, 112a and 112b, respectively. The control gates, 116a and 116b, and the select gates, 120a and 120b, are configured to control a data state stored in an adjacent floating gate, 112a and 112b. In some embodiments, spacer structures 202 may be disposed between the control gates 116 and the floating gates 112, between the control gates 116 and the common erase gate 110, and between the control gates 116 and the select gates 120. The spacer structures 202 may comprise a dielectric material, such as silicon nitride, silicon oxide such as tetra-ethyl-ortho-silicate (TEOS) or high temperature oxide (HTO), for example.

The floating gates 112, the control gate 116, the common erase gate 110, and the select gate 120 are separated by additional dielectric material 118 disposed over the semiconductor substrate 102. In some embodiments, spacer structures 202 may also be disposed between the control gates 116 and the select gate 120, the common erase gate 110, and the floating gates 112.

In some embodiments, a thickness $t_1$ of a first spacer structure 202a disposed between the control gate 116 and the common erase gate 110 is approximately equal to a thickness $t_2$ of the additional dielectric material 118 between the control gate 116 and the common erase gate 110. In some embodiments, the thickness $t_1$ of the first spacer structure 202a is less than the thickness $t_2$ of the additional dielectric material 118 between the control gate 116 and the common erase gate 110. In some embodiments, the thickness $t_2$ of the additional dielectric material 118 between the control gate 116 and the common erase gate 110 is less than a thickness $t_3$ of the additional dielectric material 118 between the floating gate 112 and the common erase gate 110.

In some embodiments, a cap layer 204 may be disposed over the control gates, 116a and 116b. The cap layer 204 may comprise a hard mask material that enables patterning of the control gates, 116a and 116b during fabrication of the flash memory cell 200. In some embodiment, a protective coating 206 may be disposed over the additional dielectric material 118. The protective coating 206 may comprise a dielectric layer, such as silicon oxide, silicon nitride or a combination thereof.

Although the common source oxide layer 114a (formed by an ISSG process) is described in FIGS. 1A-2 in the context of a flash memory cell, it will be appreciated that the disclosed common source oxide layer is not limited to such applications. Rather, the disclosed common source oxide layer may be applied to any device in which an oxide layer overlies a highly doped region (e.g., a region having a doping concentration of greater than or equal to approximately 1E19). The use of the high density, low defect common source oxide layer over a highly doped region improves the isolation of the common source oxide layer, since the low defect common source oxide layer will reduce the number of defects that are typically present above such a highly doped region (e.g., the high density, low defect common source oxide layer formed by an ISSG process will burn the defects away, thereby providing for an oxide having an improved isolation)

Figure 3:
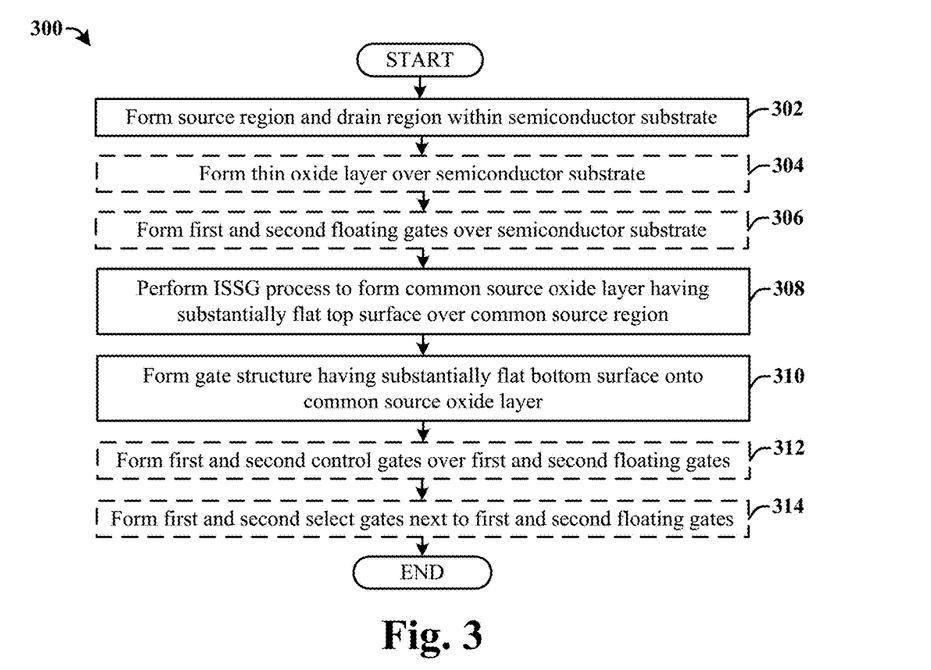
FIG. 3 is a flow diagram of some embodiments of a method of forming an embedded flash memory cell having a common source oxide layer generated using an in-situ steam generation (ISSG) process.

FIG. 3 is a flow diagram of some embodiments of a method 300 of forming a memory cell (e.g., an embedded flash memory cell) having a common source oxide layer generated using an in-situ steam generation (ISSG) process.

While the disclosed method 300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302, a source region and drain region are formed within a semiconductor substrate. The semiconductor substrate may comprise any type of semiconductor body (e.g., silicon, silicon-germanium, silicon-on-insulator) such as a semiconductor wafer and/or one or more die on a wafer, as well as any other type of semiconductor and/or epitaxial layers associated therewith. The common source region may comprise a highly doped source region (e.g., having a doping concentration that is greater than or equal to 1E19 $cm^{-3}$). The source and drain regions may be formed by selectively implanting a dopant species into the semiconductor substrate. In some embodiments, a high temperature diffusion may be performed after the implantation to drive the dopant species into the semiconductor substrate.

In some embodiments, wherein method 300 is used to form an embedded flash memory cell, the source region may comprise a common source region is formed within a semiconductor substrate at a position located laterally between a first drain region and a second drain region.

At 304, a thin oxide layer may be formed over the semiconductor substrate. In some embodiments, the thin oxide layer may comprise a core oxide layer (e.g., having a thickness in a range of between 5 and 10 nm) that is used in the formation of logic device that are formed on the same integrated circuit as the embedded flash memory cell. In other embodiments, the thin oxide layer may comprise a native oxide (e.g., having a thickness in a range of between 1 and 2 nm) formed by exposing the semiconductor substrate to an ambient environment.

At 306, a first floating gate and a second floating gate may be formed over the thin oxide layer on opposite sides of the common source region.

At 308, an in-situ steam generation (ISSG) process is performed to form a common source oxide layer having a substantially flat top surface at a position overlying the common source region. In various embodiments, the common source oxide layer may comprise silicon oxide ($SiO_2$), germanium oxide ($GeO_2$), gallium oxide ($Ga_2O_3$) or some other oxide depending upon the material of the semiconductor substrate. The ISSG process is a low-pressure rapid thermal oxidation process, in which hydrogen and oxygen are introduced into a processing chamber held at a reduced pressure, to form steam (e.g., vapor $H_2O$) at a surface of a heated semiconductor substrate. The ISSG process forms a common source oxide layer through interface oxidation of silicon and oxygen with the semiconductor substrate, causing the resulting oxide layer to expand to a greater depth within the semiconductor substrate, while maintaining a substantially flat top surface opposite the semiconductor substrate.

At 310, a gate structure having substantially flat bottom surface is formed onto common source oxide layer The substantially flat bottom surface of the common erase gate abuts the substantially flat top surface of the common source oxide layer. In some embodiments, the common erase gate may be deposited by way of a vapor deposition technique (e.g., chemical vapor deposition, physical vapor deposition, etc.). In some embodiments, the gate structure may comprise a common erase gate located over a common source region laterally disposed between a first drain region and a second drain region.

At 312, first and second control gates may be formed over the first and second floating gates. The first control gate is formed over the first floating gate and the second control gate is formed over the second floating gate. In some embodiments, the first and second select gates may be formed by way of a vapor deposition technique. In some embodiments, the first and second control gates may be formed prior to performing the ISSG process (act 308).

At 314, first and second select gates may be formed next to the first and second floating gates. The first select gate (coupled to a first word line) is formed along a side of the floating gate opposing the common erase gate and a second select gate (coupled to a second word line) is formed along a side of the floating gate opposing the common erase gate. In some embodiments, the first and second select gates may be formed by way of a vapor deposition technique.

Figure 4:
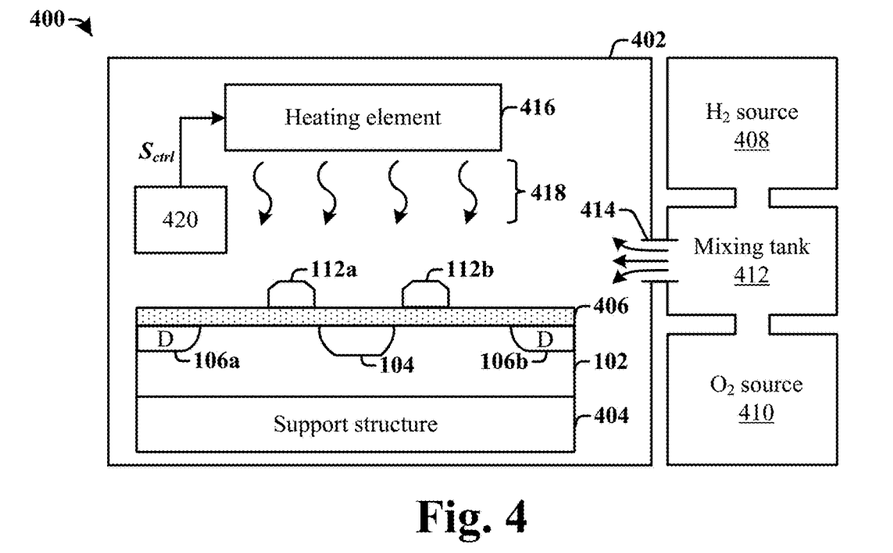
FIGS. 4-5 illustrate some embodiments of cross-sectional views corresponding to an exemplary method of forming an embedded flash memory cell having a common source oxide generated using an in-situ steam generation (ISSG) process.
Figure 5:
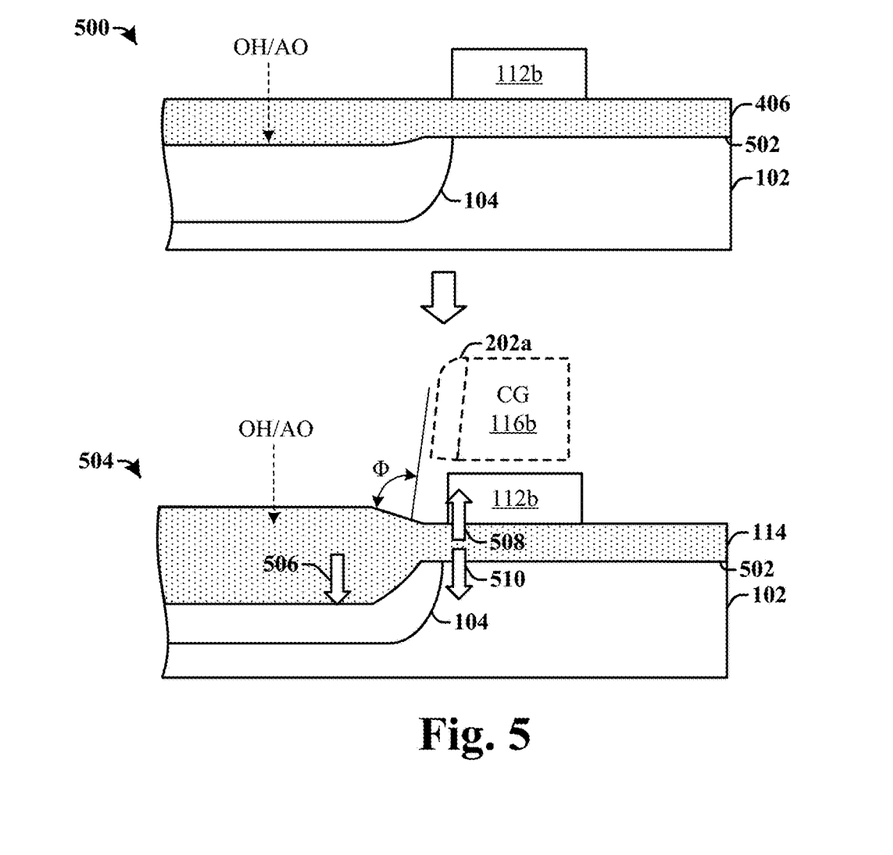

FIGS. 4-5 illustrate some embodiments of cross-sectional views corresponding to an exemplary method of forming an embedded flash memory cell having a common source oxide layer generated using an in-situ steam generation (ISSG) process.

FIG. 4 illustrates a cross-sectional view 400 of some embodiments of an in-situ steam generation (ISSG) process (corresponding to act 308).

As shown in cross-sectional view 400, a semiconductor substrate 102 is provided to a support structure 404 located within a processing chamber 402. The semiconductor substrate 102 comprises a common source region 104 disposed between a first drain region 106a and a second drain region 106b. A thin oxide layer 406 (e.g., a core oxide or a native oxide) may disposed on a top surface of the semiconductor substrate 102 at a position overlying the common source region 104. In some embodiments, the processing chamber 402 comprises a cold-wall Rapid Thermal Annealing (RTP) processing chamber. In some embodiments, the processing chamber 402 is having a range of between approximately 1 torr and approximately 20 torr.

A hydrogen gas source 408 and an oxygen gas source 410 are in communication with the processing chamber 402. The hydrogen gas source 408 is configured to provide hydrogen gas ($H_2$) to the processing chamber 402 without pre-combustion. The oxygen gas source is configured to provide oxygen gas ($O_2$) to the processing chamber 402 without pre-combustion. In some embodiments, the hydrogen gas source 408 and the oxygen gas source 410 are connected to a mixing tank 412 held at a second pressure greater than the first pressure. The mixing tank 412 is connected to the processing chamber 402 by way of an inlet 414. The $H_2$ and $O_2$ gases may be mixed within the mixing tank 412 prior to being input into the processing chamber 402. In some embodiments, the hydrogen gas source 408 and the oxygen gas source 410 may be configured to fill the processing chamber 402 with a gas mixture comprising between approximately 1% and 50% $H_2$ and between approximately 99% and 50% $O_2$.

The processing chamber 402 comprises a heating element 416 configured to heat the semiconductor substrate 102. In some embodiments, the heating element 416 may comprise a lamp (e.g., a tungsten halogen lamp). The heating element 416 may be configured to generate heat 418 that raises a top surface of the semiconductor substrate 102 to a temperature having a range of between approximately 800° C. and approximately 1100° C. In some embodiments, a temperature measurement device 420 may be configured to measure a temperature at the top surface of the semiconductor substrate 102 and to generate a control signal $S_{ctrl}$ that adjusts operation of the heating element 416 until a desired temperature is reached at the top surface of the semiconductor substrate 102.

When the $H_2$ and $O_2$ gases come into contact with the heated semiconductor substrate 102, the semiconductor substrate 102 operates as an ignition source that causes the $H_2$ and $O_2$ gases to react in-situ and to form hydroxide (OH) and atomic oxygen (AO). The hydroxide (OH) and atomic oxygen (AO) react with the semiconductor substrate 102 to form a silicon oxide. After formation of the common source oxide layer, the semiconductor substrate 102 may be rapidly cooled and removed from the processing chamber 402. In some embodiments, a cooling element (not shown) may be disposed within the processing chamber 402 at a position that allows for rapid cooling of the semiconductor substrate 102. In some embodiments, the cooling element may comprise a liquid cooling system.

FIG. 5 illustrates cross-sectional views, 500 and 504, of a semiconductor substrate 102 showing some embodiments of the formation of a common source oxide layer using an ISSG process.

As shown in cross-sectional view 500, the hydroxide (OH) and atomic oxygen (AO) diffuse into the semiconductor substrate 102 to an interface 502 located between the thin oxide layer 406 and the semiconductor substrate 102. The hydroxide (OH) and atomic oxygen (AO) react with the semiconductor substrate 102 to form a common source oxide layer. In some embodiments, the ISSG process may be performed for a processing time of between 10 sec and 180 sec. It will be appreciated that the processing time may be increased or decreased depending on a desired thickness of the common source oxide layer.

It will be appreciate also that the location and direction of oxide growth by the ISSG process may vary depending on hydrogen content and/or process time of the ISSG process. For example, at a $H_2$ content of 20% the common source oxide growth may be limited to in the downward direction shown by arrow 506. Increasing the processing time of the ISSG process and/or increasing the $H_2$ content (e.g., to greater than 20%), may cause the common source oxide growth to additionally occur below the floating gate as shown by arrows 508 and 510.

As shown in cross-sectional view 504, the ISSG process forms a common source oxide layer 114a. The common source oxide layer predominately grows in a downward direction in an area above the common source region 104, as shown by arrow 506, such that that bulging of the common source oxide layer 114a on a top surface is small. The small upward expansion of the common source oxide layer 114a reduces encroachment of the oxide on the floating gates, 112a and 112b (due to less outward oxide volume expansion), and therefore causes a first spacer structure 202a to have a more vertical orientation (i.e., a smaller spacer sidewall angle $\phi$).

Therefore, the present disclosure relates to a flash memory cell having a common source oxide layer with a substantially flat top surface, disposed between a common source region and a common erase gate, and a method of formation In some embodiments, the present disclosure relates to a memory cell. The memory cell comprises a common source oxide layer located over a source region disposed along a top surface of a semiconductor substrate. The memory cell further comprises a first drain region disposed along the top surface of the semiconductor substrate at a position that is laterally separated from the source region by a first channel region. The memory cell further comprises a common erase gate disposed onto the common source oxide layer, wherein the common erase gate comprises a substantially flat bottom surface abutting a substantially flat top surface of the common source oxide layer.

In other embodiments, the present disclosure relates to an embedded flash memory cell. The embedded flash memory cell comprises a semiconductor substrate comprising a common source region separated from a first drain region by a first channel region and separated from a second drain region by a second channel region. The embedded flash memory cell further comprises a common source oxide layer having a bottom surface abutting the common source region and a top surface. The embedded flash memory cell further comprises a first floating gate separated from the first channel region by a first floating gate oxide layer overlying the semiconductor substrate at a first position abutting the common source oxide layer, and a second floating gate separated from the second channel region by a second floating gate oxide layer overlying the semiconductor substrate at a second position abutting the common source oxide layer. The embedded flash memory cell further comprises a common erase gate disposed onto the common source oxide layer and having a substantially flat bottom surface abutting the top surface of the common source oxide layer.

In yet other embodiments, the present disclosure relates to a method of forming a memory cell. The method comprises forming a source region and a drain region within a semiconductor substrate. The method further comprises performing an in-situ steam generation (ISSG) process to form a common source oxide layer over the source region. The method further comprises forming a gate structure onto the common source oxide layer, wherein the gate structure has a substantially flat bottom surface abutting a substantially flat top surface of the common source oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell, comprising:
a common source oxide layer located over a source region disposed within a semiconductor substrate;
a first drain region disposed along a top surface of the semiconductor substrate at a position that is laterally separated from the source region by a first channel region;
a common erase gate disposed onto the common source oxide layer, wherein the common erase gate comprises a substantially flat bottom surface abutting a first flat upper surface of the common source oxide layer; and
wherein the common source oxide layer comprises a second flat upper surface overlying the first channel region and an angled surface that is angled at a non-zero acute angle with respect to the second flat upper surface and that directly connects the first flat upper surface to the second flat upper surface.

2. The memory cell of claim 1, further comprising:
a second drain region disposed along the top surface of the semiconductor substrate on an opposite side of the source region as the first drain region at a position that is laterally separated from the source region by a second channel region;
a first floating gate separated from the first channel region by a first floating gate oxide layer abutting the common source oxide layer; and
a second floating gate separated from the second channel region by a second floating gate oxide layer abutting the common source oxide layer.

3. The memory cell of claim 2, further comprising:
a first control gate disposed over the first floating gate; and
a second control gate disposed over the second floating gate.

4. The memory cell of claim 3, further comprising:
a first spacer structure separating the first control gate from the common erase gate; and
an additional dielectric material arranged between the first spacer structure and the common erase gate, and below a bottom surface of the first spacer structure and between the first floating gate and the common erase gate.

5. The memory cell of claim 1, wherein the common source oxide layer comprises a curved bottom surface that opposes the first flat upper surface, and which abuts the source region.

6. The memory cell of claim 1, further comprising:
a first select gate disposed along a side of a first floating gate opposing the common erase gate, wherein the first select gate is coupled to a first word line; and
a second select gate disposed along a side of a second floating gate opposing the common erase gate, wherein the second select gate is coupled to a second word line.

7. The memory cell of claim 1, further comprising:
a first floating gate disposed over the first channel region;
a first control gate disposed over the first floating gate; and
a sidewall spacer arranged laterally along a side of the first control gate facing the common erase gate, wherein the sidewall spacer has a sidewall facing the common erase gate that is angled with respect to a line perpendicular to the top surface of the semiconductor substrate.

8. The memory cell of claim 1, wherein the first flat upper surface of the common source oxide layer laterally extends past the source region.

9. An embedded flash memory cell, comprising:
a semiconductor substrate comprising a common source region separated from a first drain region by a first channel region;
a common source oxide layer having a bottom surface abutting the common source region and a top surface;
a first floating gate separated from the first channel region by a first floating gate oxide layer overlying the semiconductor substrate at a first position abutting the common source oxide layer;
a first control gate arranged over the first floating gate;
a common erase gate disposed onto the common source oxide layer and having a substantially flat bottom surface abutting a substantially flat top surface of the common source oxide layer; and
wherein the first floating gate oxide layer has a first height at a first location below a center of the first floating gate and a second height that is larger than the first height at a second location that is below an edge of the first floating gate and over a flat lower surface of the first floating gate oxide layer.

10. The flash memory cell of claim 9, wherein the common source oxide layer comprises a curved bottom surface that opposes the substantially flat top surface, and which abuts the common source region.

11. The flash memory cell of claim 9, wherein the common source oxide layer has a height below the common erase gate having a range of between approximately 10 nm and approximately 40 nm.

12. A flash memory cell, comprising:
a semiconductor substrate comprising a common source region laterally arranged between a first drain region and a second drain region;
a dielectric layer disposed onto the semiconductor substrate over the common source region;
a floating gate arranged over the dielectric layer at a location that is laterally between a select gate and the common source region, wherein the select gate is arranged over the dielectric layer;
a control gate vertically overlying the floating gate;
a common erase gate disposed onto the dielectric layer over the common source region;
wherein the dielectric layer comprises a first bulge overlying the common source region and protruding outward from an upper surface of the dielectric layer for a first distance, and a second bulge overlying the common source region and protruding outward from a lower surface of the dielectric layer at a location laterally offset from the floating gate for a second distance that is larger than the first distance; and
wherein the first bulge has a first sidewall facing the floating gate, which protrudes outward from the upper surface of the dielectric layer at a first location;
wherein the second bulge has a second sidewall facing the floating gate, which protrudes outward from the lower surface of the dielectric layer at a second location; and
wherein the first location is arranged laterally between the second location and a center of the floating gate.

13. The flash memory cell of claim 12, wherein the first bulge comprises angled sidewalls and a substantially flat upper surface.

14. The flash memory cell of claim 12, wherein the second bulge vertically extends to within a depression in an upper surface of the semiconductor substrate.

15. The flash memory cell of claim 12,
wherein the dielectric layer comprises a first flat upper surface underlying the floating gate, a second flat upper surface overlying the common source region, and an angled surface connecting the first flat upper surface to the second flat upper surface; and
wherein the common erase gate comprises a flat bottom surface abutting the first flat upper surface of the dielectric layer.

16. The flash memory cell of claim 15, further comprising:
a sidewall spacer arranged laterally along a side of the control gate facing the common erase gate, wherein the sidewall spacer has a sidewall facing the common erase gate that is angled with respect to a line perpendicular to an upper surface of the semiconductor substrate.

17. The flash memory cell of claim 12, wherein the floating gate has an outer edge adjacent to the common source region that is arranged between a lower surface of the floating gate and a sidewall of the floating gate and that is higher than the lower surface of the floating gate.

18. The flash memory cell of claim 17, wherein the dielectric layer has a height that is approximately 3-4 nm larger below the outer edge than below the lower surface of the floating gate.

19. The flash memory cell of claim 12, wherein the floating gate is asymmetric about a first line bisecting a width of the floating gate, and the control gate is asymmetric about a second line bisecting a width of the control gate.

20. The flash memory cell of claim 12, wherein the dielectric layer is asymmetric about a first line bisecting a height of the dielectric layer, and the control gate is asymmetric about a second line bisecting a width of the control gate.

* * * * *